US009607951B2

(12) United States Patent
Ko et al.

(10) Patent No.: US 9,607,951 B2
(45) Date of Patent: Mar. 28, 2017

(54) CHIP PACKAGE

(71) Applicant: MediaTek Singapore Pte. Ltd., Singapore (SG)

(72) Inventors: Uming Ko, Houston, TX (US); Tzu-Hung Lin, Zhubei (TW); Tai-Yu Chen, Taipei (TW)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 13/958,794

(22) Filed: Aug. 5, 2013

(65) Prior Publication Data
US 2015/0035131 A1    Feb. 5, 2015

(51) Int. Cl.
| | |
|---|---|
| H01L 23/498 | (2006.01) |
| H01L 23/495 | (2006.01) |
| H01L 23/02 | (2006.01) |
| H01L 23/04 | (2006.01) |
| H01L 23/34 | (2006.01) |
| H01L 23/00 | (2006.01) |
| H01L 23/16 | (2006.01) |

(52) U.S. Cl.
CPC ............ *H01L 23/562* (2013.01); *H01L 23/16* (2013.01); *H01L 2224/16225* (2013.01); *H01L 2224/73253* (2013.01); *H01L 2924/0002* (2013.01); *H01L 2924/15311* (2013.01)

(58) Field of Classification Search
USPC ................ 257/738, 734, 690, 710, 784, 678
See application file for complete search history.

(56) References Cited

U.S. PATENT DOCUMENTS

| | | | |
|---|---|---|---|
| 5,724,230 A | 3/1998 | Poetzinger | |
| 6,020,221 A | 2/2000 | Lim et al. | |
| 6,166,434 A * | 12/2000 | Desai et al. | ........... 257/704 |
| 7,968,999 B2 | 6/2011 | Celik et al. | |
| 8,022,534 B2 | 9/2011 | Wang et al. | |
| 8,129,828 B2 | 3/2012 | Maeda | |
| 8,183,873 B2 | 5/2012 | Kobayashi et al. | |
| 2003/0000736 A1 | 1/2003 | Sathe | |
| 2003/0062618 A1 | 4/2003 | Xie et al. | |
| 2004/0169272 A1* | 9/2004 | Hembree | ........... H01L 21/4871 257/712 |
| 2004/0183193 A1* | 9/2004 | Koide et al. | ........... 257/734 |
| 2005/0280127 A1* | 12/2005 | Zhao | ........... H01L 23/24 257/678 |

(Continued)

FOREIGN PATENT DOCUMENTS

| | | |
|---|---|---|
| CN | 1596468 | 3/2005 |
| CN | 101727576 | 6/2010 |

(Continued)

OTHER PUBLICATIONS

Machine translation of JP2003-100924.*

*Primary Examiner* — Kimberly Rizkallah
*Assistant Examiner* — Brian Turner
(74) *Attorney, Agent, or Firm* — McClure, Qualey & Rodack, LLP

(57) ABSTRACT

According to an embodiment of the present invention, a chip package is provided. The chip package includes a substrate. A chip is disposed on the substrate. A stiffener is disposed on the substrate. The thermal conductivity of the stiffener is higher than the thermal conductivity of the substrate.

16 Claims, 4 Drawing Sheets

(56) References Cited

U.S. PATENT DOCUMENTS

| | | |
|---|---|---|
| 2006/0043576 A1* | 3/2006 | Lee ............... H01L 23/3677 257/706 |
| 2007/0232090 A1* | 10/2007 | Colgan et al. ................. 439/66 |
| 2008/0150109 A1 | 6/2008 | Sunohara et al. |
| 2008/0157344 A1* | 7/2008 | Chen et al. ................... 257/706 |
| 2009/0236732 A1* | 9/2009 | Yu et al. ....................... 257/707 |
| 2011/0134606 A1* | 6/2011 | Gallarelli et al. ....... 361/679.54 |
| 2011/0140272 A1* | 6/2011 | Zhao et al. ................... 257/738 |
| 2012/0119346 A1 | 5/2012 | Im et al. |
| 2013/0168857 A1* | 7/2013 | Gregorich et al. ........... 257/738 |
| 2014/0167243 A1* | 6/2014 | Shen ............................. 257/692 |
| 2014/0291001 A1 | 10/2014 | Lin et al. |

FOREIGN PATENT DOCUMENTS

| | | |
|---|---|---|
| EP | 0 718 882 | 6/1996 |
| JP | 2003100924 | 4/2003 |
| JP | 2003100924 A * | 4/2003 |
| TW | 200830493 | 7/2008 |
| TW | 200937539 | 9/2009 |
| TW | 200943500 | 10/2009 |
| TW | 201021636 | 6/2010 |
| TW | 201234542 | 8/2012 |
| TW | 201324700 | 6/2013 |

\* cited by examiner

CHIP PACKAGE

BACKGROUND OF THE INVENTION

Field of the Invention

The invention relates to a chip package, and in particular, relates to a chip package having a thin package substrate.

Description of the Related Art

A chip package not only provides protection for chips from environmental contaminants, but also provides a connection interface for chips packaged therein. Stacked packaging schemes, such as package-on-package (POP) packaging, have become increasingly popular.

Currently, the size of the chip package has become smaller such that reliability and structural stability of the chip package are reduced. Thus, improving reliability and structural stability of a chip package has become an important issue.

BRIEF SUMMARY OF THE INVENTION

According to an embodiment of the present invention, a chip package is provided. The chip package includes: a substrate; a chip disposed on the substrate; and a stiffener disposed on the substrate, wherein the stiffener has a thermal conductivity higher than that of the substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

Figure 1:
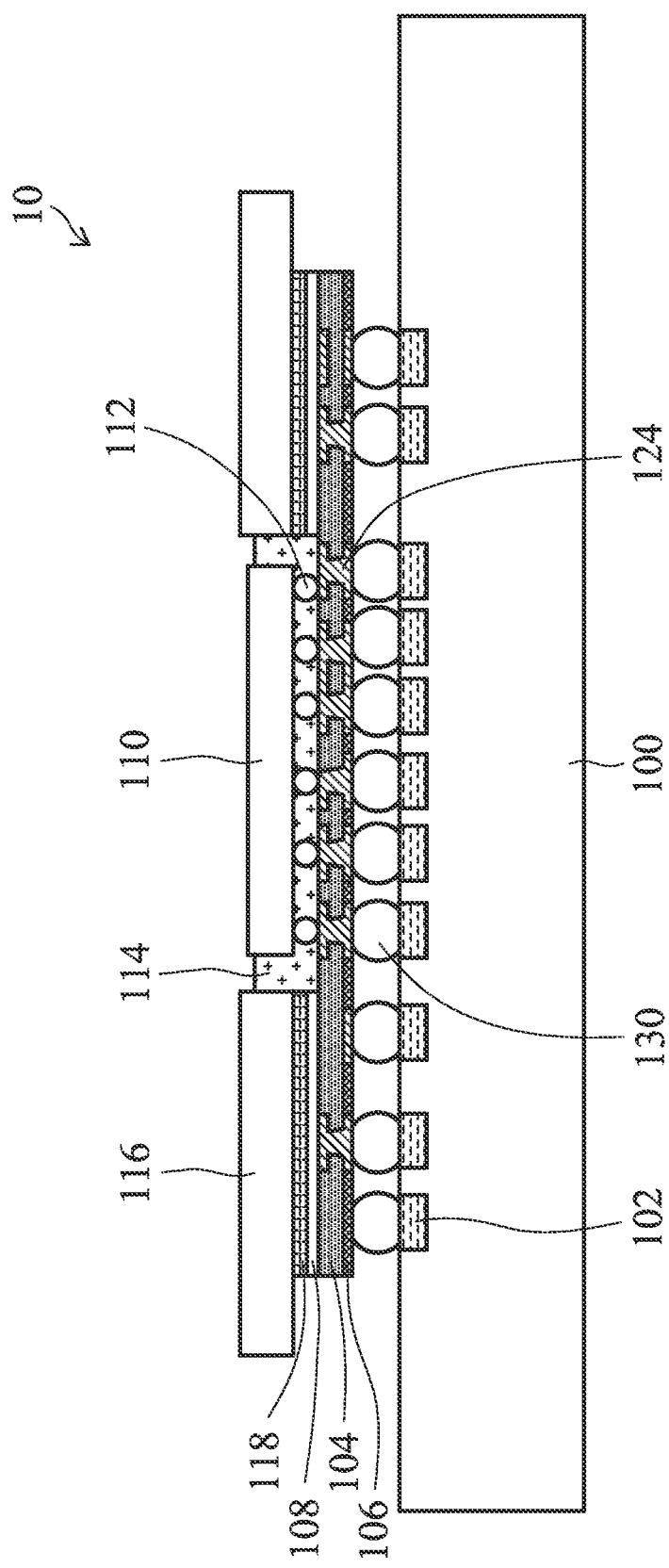
FIG. 1 is a cross-sectional view showing a chip package according to an embodiment of the present invention.

FIG. 1 is a cross-sectional view showing a chip package 10 according to an embodiment of the present invention. As shown in FIG. 1, a substrate 104 is provided. The substrate 104 may include a dielectric material such as an organic material. The organic material can be PP (Polypropylene) with glass fiber, epoxy resin, polyimide, cyanate ester, or combinations thereof. Two protection layers 106 and 108 may be formed on opposite surfaces of the substrate 104. In another embodiment, the substrate 104 may include a semiconductor material such as silicon. A plurality of conducting elements 112 and a plurality of conducting elements 130 which are, for example, (but is not limited to) conducting bumps and/or conducting balls are disposed on the opposite surfaces of the substrate 104. A chip 110 is disposed on the substrate 104. In one embodiment, electrical signals may be transmitted between the chip 110 and electronic elements disposed on the opposite surface of the substrate 104 through conducting structures 124 formed in the substrate 104. In addition, a filling layer 114 may be optionally disposed on the substrate 104 to at least partially surround the chip 110. The filling layer 114 may protect the chip 110 from being damaged and/or polluted. The conducting structure 124 may include a conducting via penetrating through the substrate 104. Thus, the substrate 104 may serve as a package substrate or an interposer.

Another substrate 100 which is, for example, (but is not limited to) a printed circuit board may be optionally provided. The substrate 104 and the chip 110 may be disposed on an upper surface of the substrate 100. In one embodiment, the substrate 104 may have a thickness smaller than that of the substrate 100. Electrical signals may be transmitted between the substrate 100 and the chip 110 through the conducting elements 130, the conducting structures 124, and the conducting elements 112 therebetween. In one embodiment, a plurality of conducting pads 102 may be disposed on or in the substrate 100. The conducting element 130 may be in electrical contact with the conducting pad 102.

Currently, with demand for light, thin, and compact electronic products, the size of a chip package has continued to shrink. The thickness of the substrate 104 has accordingly been reduced. For example, the thickness of the substrate 104 may range between about 100 µm and about 200 µm. In another embodiment, the thickness of the substrate 104 may range between about 20 µm and 80 µm. Because the thickness of the substrate 104 has decreased, the structural strength of the substrate 104 has also decreased. The substrate 104 carrying the chip 110 may suffer warpage problems such that the step of disposing the substrate 104 on another electronic element such as the substrate 100 becomes difficult to be performed. Thus, the reliability and the structural stability of the chip package are insufficient.

In order to enhance the structural stability and the reliability of the chip package, a stiffener 116 is disposed on the substrate 104 to prevent the substrate 104 from warping. In addition, it is preferable that the stiffener 116 has a thermal conductivity higher than that of the substrate 104. Thus, not only the structural strength and the reliability of the chip package are enhanced, but also the dissipation of the heat generated during the operation of the chip is improved. The stiffener 116 may include (but is not limited to) stainless steel, copper, aluminum, gold, silver, alloys made of different metal materials, or combinations thereof. In addition, the stiffener may include a plurality of fins, and the heat dissipation may be improved. A bonding layer 118 may be optionally disposed between the stiffener 116 and the substrate 104 to increase adhesion between the stiffener 116 and the substrate 104. The bonding layer 118 may include an adhesive polymer layer which may further include silver, gold, copper, or combinations thereof. Alternatively, the bonding layer 118 may be a metal layer.

As shown in FIG. 1, in one embodiment, the stiffener 116 may be in direct contact with the filling layer 114. In one embodiment, the stiffener 116, the filling layer 114, and the chip 110 may together cover the entire upper surface of the substrate 104. In another embodiment, the stiffener 116 may cover a portion of the upper surface which is not covered by the filling layer 114 and the chip 110. In one embodiment, the stiffener 116 may extend beyond an edge of the substrate 104.

Figure 2:
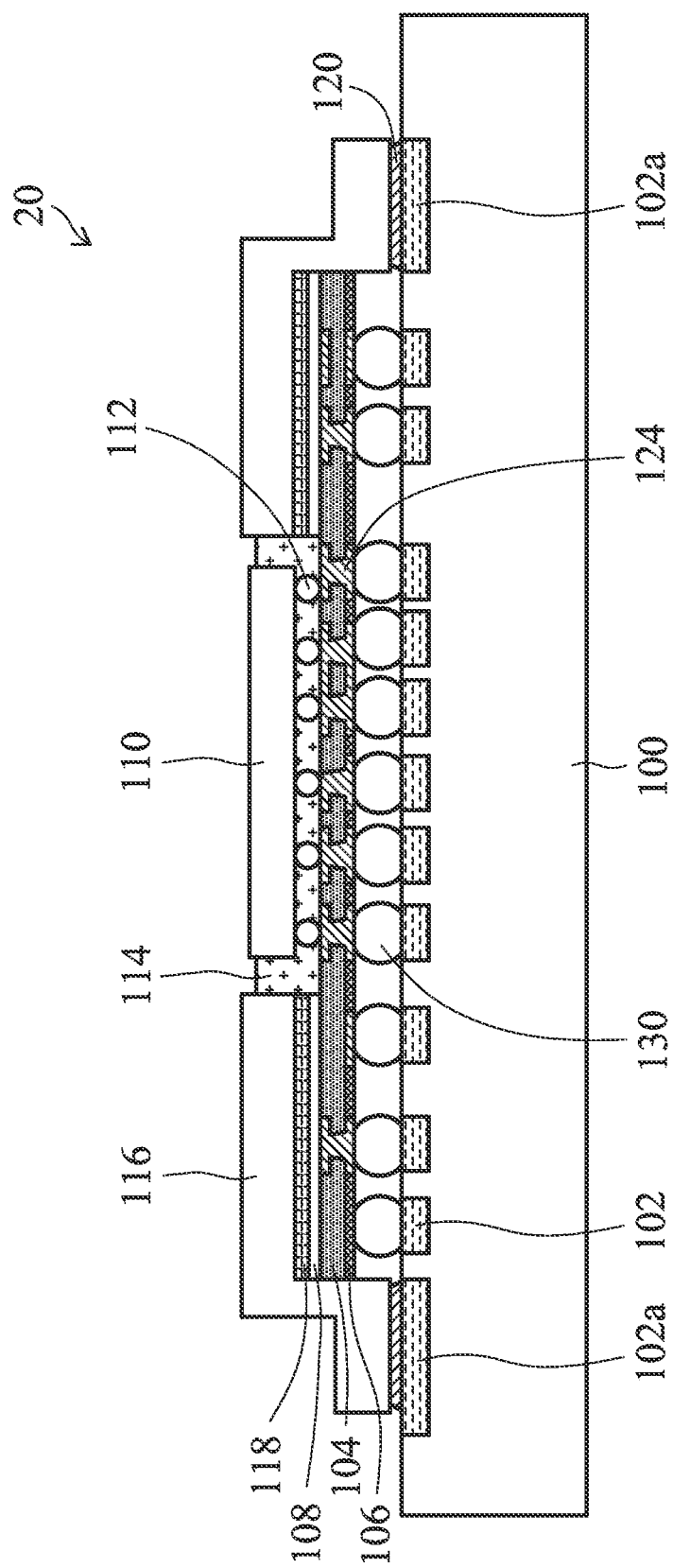
FIG. 2 is a cross-sectional view showing a chip package according to an embodiment of the present invention.

FIG. 2 is a cross-sectional view showing a chip package according to an embodiment of the present invention, wherein same or similar reference numbers are used to designate same or similar elements. In this embodiment, the stiffener 116 may further extend on the top surface of the substrate 100. For example, the stiffener 116 may extend on a conducting pad 102a disposed on or in the substrate 100. If the stiffener 116 is a conductive material, the stiffener 116 may electrically contact with the conducting pad 102a. In one embodiment, the conducting pad 102a is a ground pad, and the stiffener 116 may also have a shielding function to prevent signal interference. A solder joint 120 may be optionally disposed between the conducting pad 102a and the stiffener 116. The stiffener 116 may be in direct contact with the side surface of the substrate 104. Thus, the structural strength of the substrate 104 may be improved, and heat dissipation of the substrate 104 may be improved.

Figure 3:
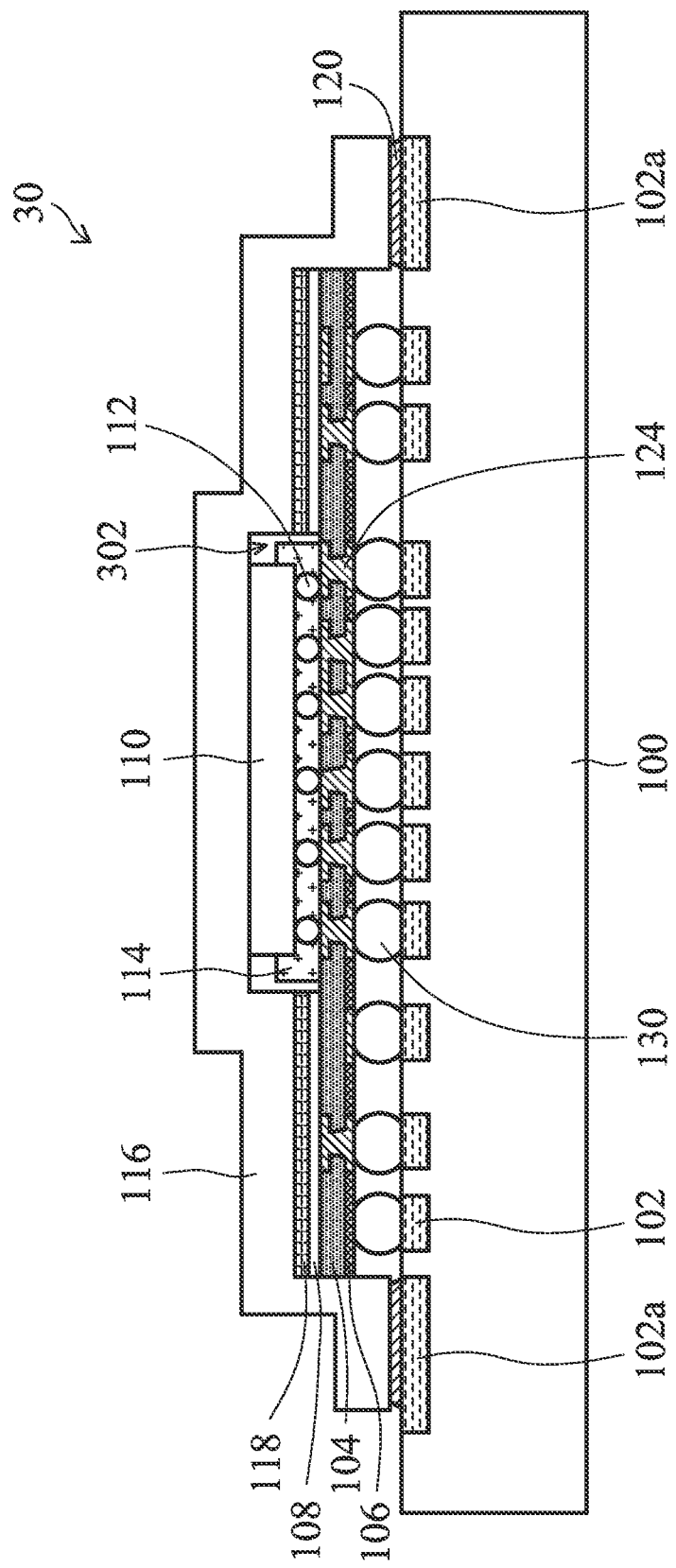
FIG. 3 is a cross-sectional view showing a chip package according to an embodiment of the present invention.

FIG. 3 is a cross-sectional view showing a chip package according to an embodiment of the present invention, wherein same or similar reference numbers are used to designate same or similar elements. In this embodiment, the stiffener 116 may extend onto the top surface of the chip 110. The stiffener 116 may be in direct contact with the chip 116. Thus, the chip 110 is protected in a better manner and heat dissipation of the chip 110 is improved. In this embodiment, the stiffener 116 may not be in direct contact with the filling layer 114. There may be a gap 302 between the stiffener 116 and the filling layer 114.

Figure 4:
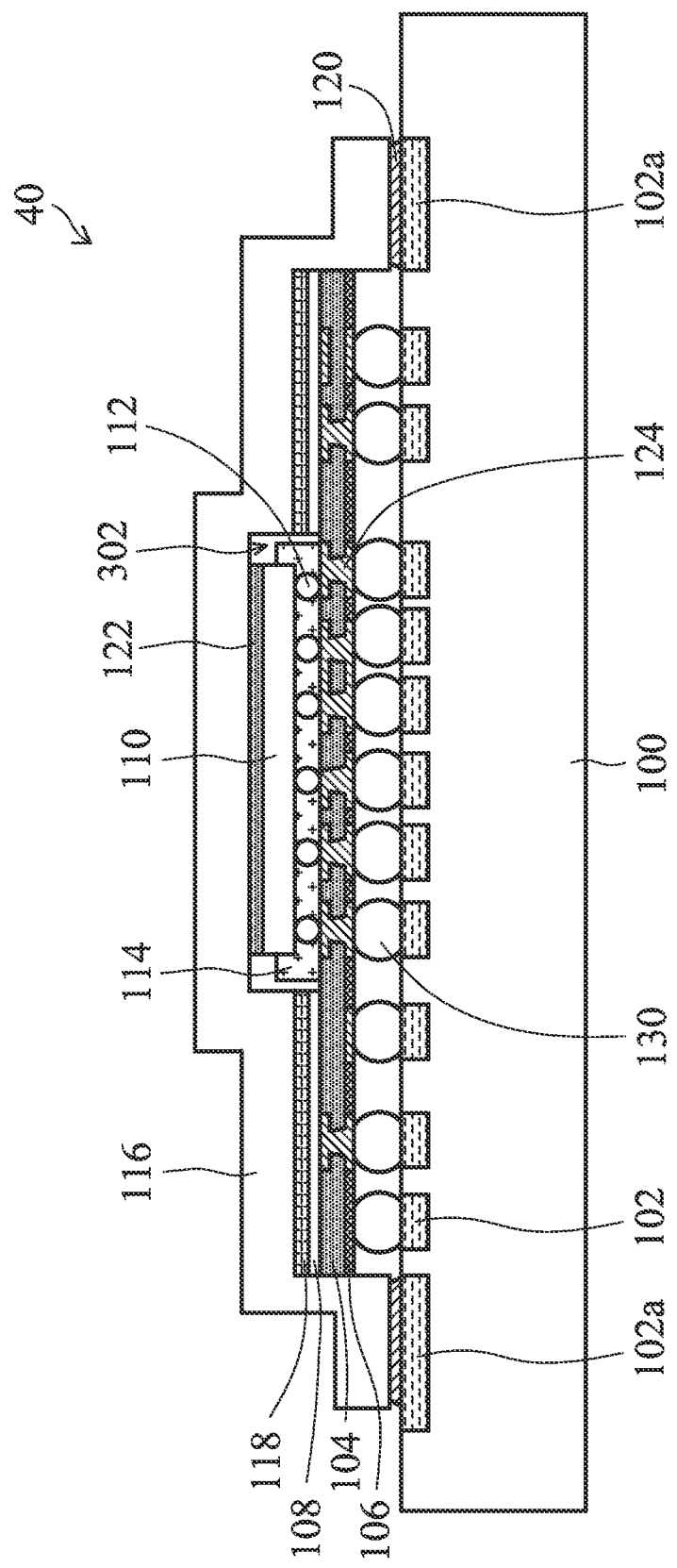
FIG. 4 is a cross-sectional view showing a chip package according to an embodiment of the present invention.

FIG. 4 is a cross-sectional view showing a chip package according to an embodiment of the present invention, wherein same or similar reference numbers are used to designate same or similar elements. In this embodiment, a bonding layer 122 may be optionally disposed between the top surface of the chip 110 and the stiffener 116. The bonding layer 122 may include any suitable thermal conductive media such as (but is not limited to) a silver glue.

In the embodiments of the invention, both the reliability and the heat dissipation of the chip package are improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a first substrate;
   a chip disposed on the first substrate;
   a stiffener disposed on the first substrate, wherein the stiffener has a thermal conductivity higher than that of the first substrate, the chip is exposed by an opening of the stiffener, and the stiffener is in direct physical contact with an outer side surface of the first substrate; and
   a second substrate, wherein the second substrate is a printed circuit board, the first substrate and the chip are disposed on a surface of the second substrate, the stiffener extends on a conducting pad disposed on or in the second substrate, and the stiffener electrically connects with the conducting pad and has a shielding function to prevent signal interference.

2. The chip package as claimed in claim 1, wherein the stiffener extends beyond an edge of the first substrate.

3. The chip package as claimed in claim 1, wherein the stiffener extends on a top surface of the chip.

4. The chip package as claimed in claim 3, further comprising a bonding layer disposed between the top surface of the chip and the stiffener.

5. The chip package as claimed in claim 1, wherein the stiffener is in direct contact with the chip.

6. The chip package as claimed in claim 1, further comprising a filling layer disposed on the first substrate and surrounding a portion of the chip.

7. The chip package as claimed in claim 6, wherein the stiffener is in direct contact with the filling layer.

8. The chip package as claimed in claim 6, wherein the stiffener is not in direct contact with the filling layer.

9. The chip package as claimed in claim 1, further comprising a bonding layer disposed between the first substrate and the stiffener.

10. The chip package as claimed in claim 1, further comprising a plurality of conducting elements disposed between the first substrate and the second substrate.

11. The chip package as claimed in claim 1, wherein the conducting pad is a ground pad.

12. The chip package as claimed in claim 1, further comprising a solder joint disposed between the conducting pad and the stiffener.

13. The chip package as claimed in claim 1, wherein the stiffener comprises stainless steel, copper, aluminum, gold, silver, or combinations thereof.

14. The chip package as claimed in claim 1, wherein the first substrate comprises an organic material.

15. The chip package as claimed in claim 1, further comprising a plurality of conducting elements disposed between the chip and the first substrate.

16. The chip package as claimed in claim 1, wherein the first substrate has a thickness smaller than that of the second substrate.

\* \* \* \* \*